US009297586B2

(12) United States Patent
Hayashida

(10) Patent No.: US 9,297,586 B2
(45) Date of Patent: Mar. 29, 2016

(54) METHOD OF GENERATING CRACKS IN POLYCRYSTALLINE SILICON ROD AND CRACK GENERATING APPARATUS

(71) Applicant: MITSUBISHI MATERIALS CORPORATION, Tokyo (JP)

(72) Inventor: Syuuhei Hayashida, Yokkaichi (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 352 days.

(21) Appl. No.: 13/924,837

(22) Filed: Jun. 24, 2013

(65) Prior Publication Data
US 2014/0000318 A1    Jan. 2, 2014

Related U.S. Application Data

(62) Division of application No. 12/805,308, filed on Jul. 23, 2010, now Pat. No. 8,490,901.

(30) Foreign Application Priority Data

Jul. 28, 2009  (JP) ................................. 2009-175441

(51) Int. Cl.
*B02C 19/18* (2006.01)
*F27D 9/00* (2006.01)
*C30B 15/00* (2006.01)
*C30B 15/02* (2006.01)
*C30B 29/06* (2006.01)

(52) U.S. Cl.
CPC . *F27D 9/00* (2013.01); *B02C 19/18* (2013.01); *B02C 19/186* (2013.01); *C30B 15/00* (2013.01); *C30B 15/02* (2013.01); *C30B 29/06* (2013.01)

(58) Field of Classification Search
CPC ........... B02C 19/00; F27D 9/00; C30B 29/06; C30B 15/02; C30B 15/00
USPC ........................................ 65/209; 241/23, 65
See application file for complete search history.

(56) References Cited

U.S. PATENT DOCUMENTS

| 4,565,913 A | 1/1986 | Yatsurugi et al. |
| 4,871,117 A | 10/1989 | Baueregger et al. |
| 5,660,335 A | 8/1997 | Köppl et al. |
| 6,874,713 B2 | 4/2005 | Arvidson et al. |

FOREIGN PATENT DOCUMENTS

| DE | 4316626 A1 | 11/1994 |
| EP | 1391252 A1 | 2/2004 |
| EP | 2062854 A1 | 5/2009 |
| JP | 60-033210 A | 2/1985 |
| JP | 06-271309 A | 9/1994 |
| JP | 2004-091321 A | 3/2004 |
| JP | 2005-288332 A | 10/2005 |
| WO | WO-2009/019749 A1 | 2/2009 |

OTHER PUBLICATIONS

European Search Report dated Sep. 30, 2010, issued for the European Patent Application No. 10171153.9.

*Primary Examiner* — Mark Rosenbaum
(74) *Attorney, Agent, or Firm* — Locke Lord LLP

(57) ABSTRACT

A method of generating cracks in a polycrystalline silicon rod, comprising: heating a polycrystalline silicon rod; and subsequently performing local portion cooling of the polycrystalline silicon rod to apply a refrigerant fluid onto a spot-like area of a surface of the polycrystalline silicon rod.

4 Claims, 10 Drawing Sheets

METHOD OF GENERATING CRACKS IN POLYCRYSTALLINE SILICON ROD AND CRACK GENERATING APPARATUS

This application is a divisional application of U.S. application Ser. No. 12/805,308, filed Jul. 23, 2010 now U.S. Pat. No. 8,490,901 which claims the right of priority under 35 U.S.C. §119 based on Japanese Patent Application No. 2009-175441 filed Jul. 28, 2009.

BACKGROUND OF THE INVENTION

1. Field of the Invention

The present invention relates to a method of generating cracks in a polycrystalline silicon rod so as to crush the polycrystalline silicon rod into lumps.

Priority is claimed on Japanese Patent Application No. 2009-175441, filed on Jul. 28, 2009, the content of which is incorporated herein by reference.

2. Description of Related Art

Czochralski method (CZ method) is used to produce single crystal silicon for semiconductor devices. In the CZ method, lumps of polycrystalline silicon are installed in a crucible and molten in the crucible, and a single crystal silicon is pulled up from the silicon melt.

The polycrystalline silicon can be produced by Siemens method. Since a rod-shaped body of polycrystalline silicon is formed in the Siemens method, it is necessary to process the rod into lumps of appropriate size so as to install the polycrystalline silicon in the crucible efficiently. The polycrystalline silicon rod is a brittle material and is crushed to fragments of appropriate size using a hammer or the like. In a technique conventionally known, the polycrystalline silicon rod may be subjected to a preliminary treatment to generate cracks in the rod before crushing the rod. In the preliminary treatment, a heated polycrystalline silicon rod is quenched by immersing the rod in pure water, thereby causing thermal strain in the silicon rod. As a result, cracks are generated in the polycrystalline silicon rod.

For example, PCT International Publication, WO2009/019749 describes an apparatus of heating and quenching a silicon. In this apparatus, a rod-shaped polycrystalline silicon is placed on a supporting unit, and is heated in a heating unit. After removal from the heating unit, the polycrystalline silicon placed on the supporting unit is subjected to quenching in a quenching unit. The supporting unit is constituted of a plurality of pipes, and the polycrystalline silicon rod may be heated and quenched at a state being supported on the pipes. The quenching unit is configured such that the supporting unit supporting the polycrystalline silicon may be immersed in a water bath.

Japanese Unexamined Patent Application, First Publication No. 2005-288332 describes an apparatus of crushing a polycrystalline silicon rod. The apparatus has a heating furnace for heating the polycrystalline silicon. A supporting table to support the polycrystalline silicon rod thereon is equipped inside the heating furnace. In the configuration of the crushing apparatus, the polycrystalline silicon rod is placed on the supporting table and heated at that state. After the heating, the polycrystalline silicon rod is dropped in a water bath, thereby generating cracks in the rod.

In the method described in Japanese Unexamined Patent Application, First Publication No. 2004-91321, cracks are generated in a polycrystalline silicon by spraying a fluid such as water to a heated polycrystalline silicon, where the fluid is sprayed with a cone spray pattern or a flat fan spray pattern.

In the method described in Japanese Unexamined Patent Application, First Publication No. S60-33210, a rod-shaped polycrystalline silicon is crushed using induction heating of the rod using a micro wave. Where the polycrystalline silicon is not crushed using the micro wave, pure water is sprayed from surroundings of the polycrystalline silicon to its periphery to enhance the crushing.

Cracks may be generated in a surface and interior portion in the vicinity of the surface of polycrystalline silicon rod by heating the rod and immersing the rod in the water bath or by spraying water from the surrounding of the rod. However, since a polycrystalline silicon rod produced by the Siemens method has a diameter of, for example, 120 mm to 160 mm, it is difficult to generate cracking in a center (core) portion of the polycrystalline silicon rod, resulting in an uncracked or crack-less core portion, a so-called residual core. After the thermal shock process, the polycrystalline silicon rod is crushed to fragments by impact using hammer or the like. Where the polycrystalline silicon having the residual core is crushed to lumps of, for example, 45 mm or less in maximum length, it costs a long time for crushing the residual core portion.

Based on the consideration of the above-described circumstance, an object of the present invention is to provide a method of generating cracks in a polycrystalline silicon rod and a crack generating apparatus used in the method whereby occurrence of residual core is avoided and cracks are generated in the entire portion of the polycrystalline silicon rod, and the polycrystalline silicon rod can be crushed into small sized lumps utilizing the cracks as origins of breaking. Another object of the present invention is to provide a method of producing polycrystalline silicon lumps utilizing the method of generating cracks.

SUMMARY OF THE INVENTION

A method of generating cracks in a polycrystalline silicon rod according to the present invention includes heating a polycrystalline silicon rod, and subsequently performing cooling of the polycrystalline silicon rod, thereby generating cracks in the polycrystalline silicon rod, wherein the cooling includes local portion cooling where a refrigerant fluid is applied onto at least one spot-like area of a surface of the polycrystalline silicon rod.

It is considered that occurrence of residual core (crackless or crack-free core portion) in the time of cooling the polycrystalline silicon rod is caused by relatively slow cooling rate of the core (central) portion compared to the cooling rate of the outer portion. That is, the occurrence of the residual core is considered to be a phenomenon caused by the conventional cooling conditions where a periphery of the polycrystalline silicon rod is cooled uniformly. On the other hand, where a refrigerant fluid is applied to one side of the surface of the polycrystalline silicon rod to cool a localized portion, the polycrystalline silicon rod is cooled from the localized portion. As a result, thermal distribution in a transverse section of the polycrystalline silicon rod including a portion (contact portion) in contact with the refrigerant fluid, that is, the spot-like area applied with the refrigerant fluid, shows thermal gradient spreading from the partial portion (the spot-like area) of the peripheral surface. As a result, effect of cooling is smallest at a position opposite to the contact portion, that is, at a position substantially axisymmetric to the contact portion about an axis of the rod. Therefore, thermal gradient across the core portion occurs by the local cooling of the partial portion of the surface of the polycrystalline silicon rod. As a result, cracks generated from the outer periphery propagate to the core portion.

The spot-like area to which the refrigerant fluid is applied may be set at an appropriate position depending on a size of the polycrystalline silicon rod.

In the above-described method of generating cracks in a polycrystalline silicon rod, the refrigerant fluid may be ejected from nozzles arranged on both sides of the polycrystalline silicon rod, wherein a plurality of nozzles are arranged with spaces between adjacent nozzles on each side of the polycrystalline silicon rod along a lengthwise direction of the rod such that a substantially middle position of each space between adjacent nozzles on a first side (one side) faces a nozzle on a second side opposite to the first side.

In the above-described method, the plurality of nozzles are arranged in staggered formation such that the position of each nozzle (except for one or two nozzles at the end of the arrangement) faces a substantially middle position in a space between adjacent nozzles on the opposite side.

It is important to make the cracks propagate in radially inward direction of the polycrystalline silicon rod so as to generate cracks propagating to the core portion (central portion) of the polycrystalline silicon rod. By the above-described arrangement of the nozzles, it is possible to make the cracks propagate radially inward from both sides of the polycrystalline silicon rod, thereby suppressing interference in the propagation of cracks between spot-like areas applied with the refrigerant fluid by the adjacent nozzles.

In the above-described method of generating cracks in the polycrystalline silicon rod, the nozzles that eject the refrigerant fluid may have a cross-sectional area of aperture (bore) of not less than 0.5 mm$^2$ and not more than 20 mm$^2$, and a distance from the ends of the nozzles to the surface of the polycrystalline silicon rod may be not shorter than 1 mm and not longer than 200 mm.

In the above-described method of generating cracks in the polycrystalline silicon rod, the refrigerant fluid may be applied to the polycrystalline silicon rod with a flow rate of 0.0006 to 0.006 m$^3$/minute on each spot-like area of the surface of the polycrystalline silicon rod.

The above-described method of generating cracks in the polycrystalline silicon rod may further include an entire portion cooling where a refrigerant substance is made to contact an entire surface of the polycrystalline silicon rod after the local portion cooling.

By the local portion cooling of the polycrystalline silicon rod, cracks are generated in the surface portion and propagate from the surface towards the core portion of the polycrystalline silicon rod. By making the refrigerant substance contact an entire portion of the polycrystalline silicon rod after the local portion cooling, it is possible to, not only cool the outer surface of the polycrystalline silicon rod, but also to make the refrigerant substance permeate through the cracks into the core portion of the rod, thereby generating new (secondary) cracks propagating from the fracture surfaces of the original cracks while propagating the original cracks. As a result, it is possible to generate cracks propagating in the core portion, as well as cracks propagating from the outer surface of the polycrystalline silicon rod.

The refrigerant substance may be easily made to contact the entire surface of the polycrystalline silicon rod by immersing the polycrystalline silicon rod in the refrigerant fluid such as water filled in a bath. In this case, since the cracks are preliminary generated in the polycrystalline silicon rod by the local portion cooling, the refrigerant fluid (e.g., water) rapidly penetrate through the cracks when the polycrystalline silicon rod is immersed in a cooling bath (e.g., water bath).

The refrigerant substance is not limited to the water. For example, cooled air, dry ice or the like may also be used as the refrigerant substance.

A method of producing a polycrystalline silicon lump (lumps) include generating cracks in a polycrystalline silicon rod in accordance with the above-described method of generating cracks in a polycrystalline silicon rod, and crushing the polycrystalline silicon rod into lumps by mechanical impact after performing the entire portion cooling of the polycrystalline silicon rod.

Since cracks are generated in the inner portion of the polycrystalline silicon by the local portion cooling and the entire portion cooling, the polycrystalline silicon rod is easily crushed into lumps of polycrystalline silicon by the mechanical impact. Therefore, it is possible to obtain lumps of a desired size while avoiding an occurrence of a residual core. The mechanical impact may be applied to the polycrystalline silicon rod by hammer blow or by using a machine, for example, a jaw-crusher or the like.

An apparatus according to the present invention is an apparatus of generating cracks in a polycrystalline silicon rod by heating a polycrystalline silicon rod and subsequently cooling the polycrystalline silicon rod, the apparatus including a heating unit that heats the polycrystalline silicon rod, and a local portion cooling unit that can apply a refrigerant fluid onto at least one spot-like area of a surface of the polycrystalline silicon rod.

The local portion cooling unit of the above-described apparatus may include nozzles which are arranged on both sides of a setting position of the polycrystalline silicon rod, wherein a plurality of nozzles are arranged with spaces between adjacent nozzles on each side of the polycrystalline silicon rod along a lengthwise direction of the rod such that a middle position of each space between adjacent nozzles on a first side faces (is opposite to) a nozzle on a second side.

The above-described apparatus of generating cracks in the polycrystalline silicon rod may further include an entire portion cooling unit that makes a refrigerant substance to contact an entire surface of the polycrystalline silicon rod.

By using the entire portion cooling unit, the refrigerant substance is supplied through the cracks to the core portion of the polycrystalline silicon rod. Therefore, it is possible to avoid an occurrence of residual core. Preferably, the refrigerant substance may be a refrigerant fluid.

According to the present invention, a partial portion of a surface of a polycrystalline silicon rod may be cooled locally by applying a refrigerant fluid onto one or a plurality of spot-like areas of the surface of the polycrystalline silicon rod. Therefore, it is possible to generate a thermal distribution showing thermal gradient from the outer surface towards the core portion, and across the core portion of the polycrystalline silicon rod, thereby generating cracks. Propagation and/or generation of cracks in the polycrystalline silicon rod may be further enhanced by subjecting the polycrystalline silicon rod after the local-portion cooling to the entire portion cooling. As a result, it is possible to generate cracks in the entire portion of the polycrystalline silicon rod while avoiding an occurrence of a residual core, and thereby improving efficiency of crushing the polycrystalline silicon rod.

BRIEF DESCRIPTION OF THE DRAWINGS

FIGS. 5A and 5B show schematic diagrams showing isothermal lines of a thermal distribution in a section of a polycrystalline silicon rod applied with water. FIG. 5A shows a transversal cross section and FIG. 5B shows a longitudinal cross section of a rod. FIG. 5C shows a partial cross section of a polycrystalline silicon rod applied with a refrigerant fluid.

DETAILED DESCRIPTION OF THE INVENTION

In the following, some embodiments of the present invention are explained with reference to drawings.

Firstly, an embodiment of a crack-generating apparatus (apparatus of generating cracks in a polycrystalline silicon rod) is explained.

Figure 2:
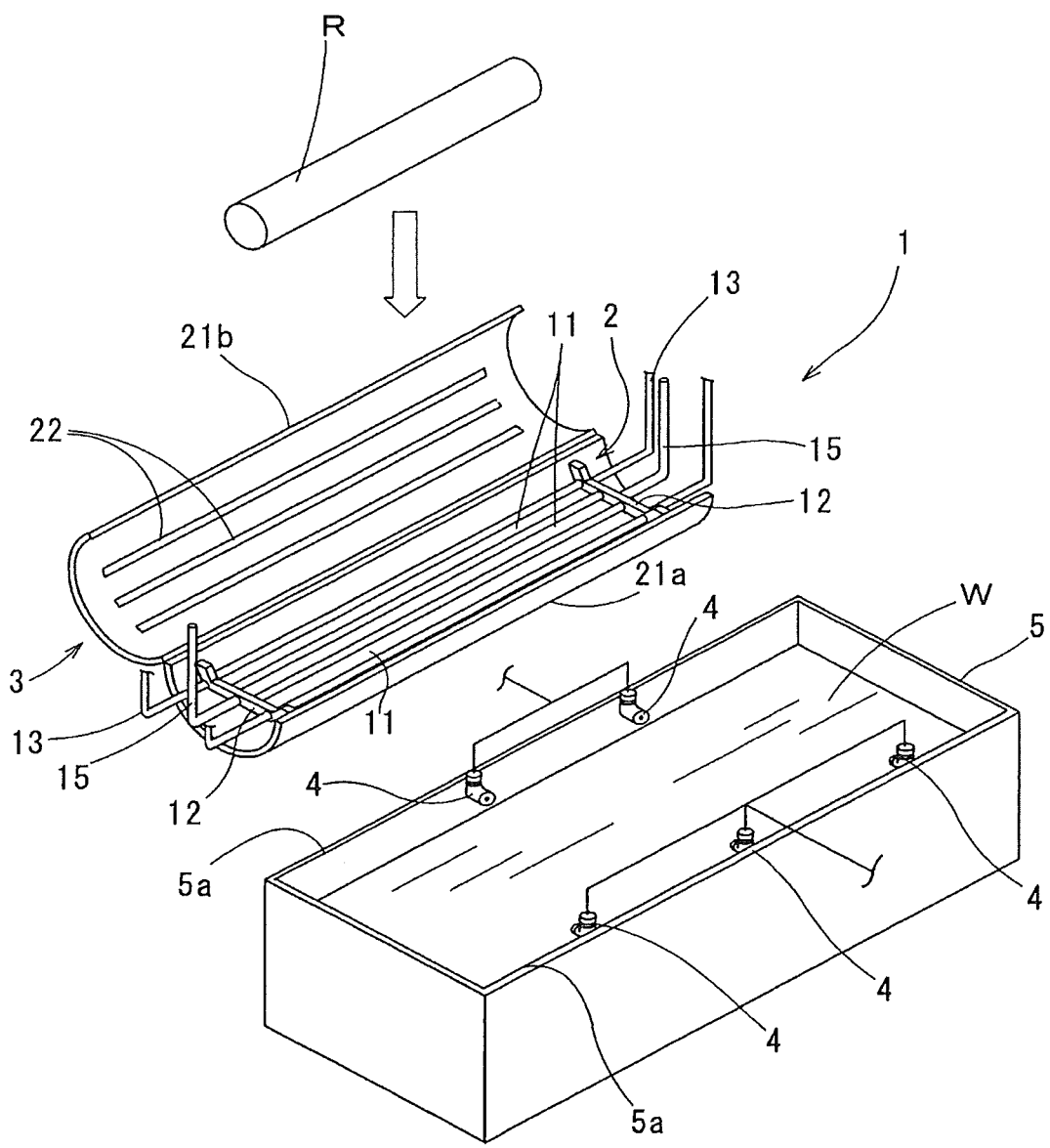
FIG. 2 is a perspective view of an schematic constitution of a crack generating apparatus according to an embodiment.
Figure 3:
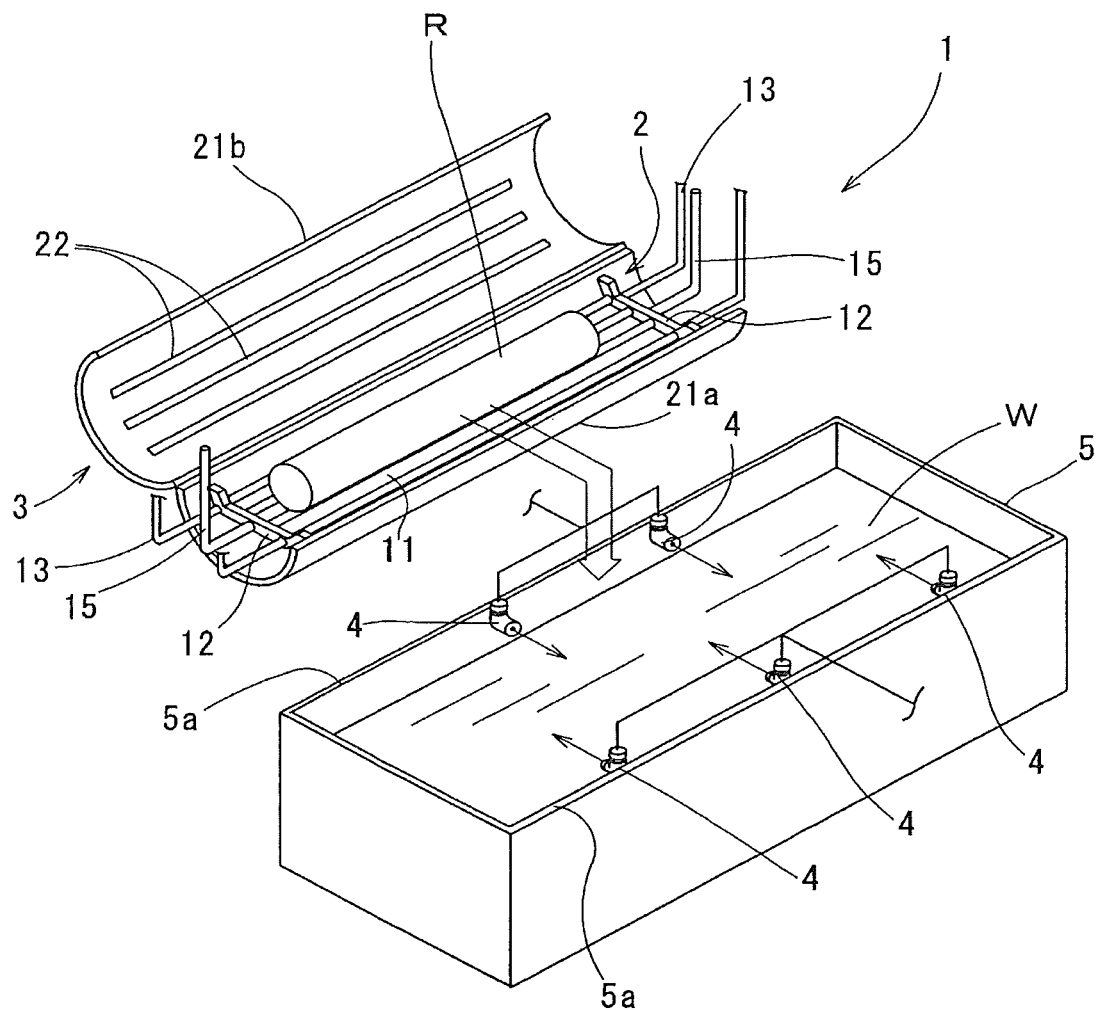
FIG. 3 is a perspective view showing a state where a polycrystalline silicon rod is placed on a support in the crack generating apparatus shown in FIG. 2.

As shown in FIG. 2 and FIG. 3, a crack generating apparatus 1 of this embodiment includes a support 2, a heating unit (heating vessel) 3, a plurality of nozzles 4, and a water bath 5. The support 2 supports a polycrystalline silicon rod R placed thereon. The heating unit 3 heat the polycrystalline silicon rod R placed on the support 2. The plurality of nozzles 4 constitute a local portion cooling unit to apply a refrigerant fluid onto one or a plurality of spot-like areas of a surface of the polycrystalline silicon rod R conveyed (transferred) from the heating unit 3 by movement of the support 2. The water bath 5 constitute an entire portion cooling unit in which the polycrystalline silicon rod R at a state placed on the support 2 is immersed in pure water.

The support 2 is constituted of a plurality of pipe members 11 which are arranged with spaces in between and are integrated to constitute a table. The pipe members 11 are communicated to header members 12 that are arranged on both ends of the pipe members 11. The header members 12 are suspended by suspending members 13 from a conveyer (not shown).

Each of the pipe members 11 is made of, for example, stainless steel (SUS) and is formed longer than a polycrystalline silicon rod R. Cooling water supplied through a supply/exhaust pipe 15 flows in the pipe members 11. The header members 12 that connect the pipe members 11 to the supply/exhaust pipe 15 support both ends of each of the pipe members 11, bundle the pipe members 11, and are supported by the suspending members 13 suspended from the conveyer. By being conveyed by the conveyer, the support table 2 may shuttle between the heating unit 3 and the water bath 5.

The heating unit 3 has two semi-cylindrical members 21a, 21b which are longer than the pipe members 11, connected by a hinge portion allowing opening and closing movement, and supported in a lateral (e.g., horizontal) alignment by a framework (not shown) of the apparatus. An appropriate numbers of heaters 22 are provided to the inner surfaces of the semi-cylindrical members 21a, 21b. By closing the semi-cylindrical members 21a, 21b to constitute a cylinder and by arranging the support 2 inside the cylinder, it is possible to surround the support 2 by the semi-cylindrical members 21a, 21b. In this embodiment, a lower semi-cylindrical member 21a is fixed to a framework of the apparatus at a state opened to the upside. The upper semi-cylindrical member 21b is opened and closed by a driving unit (not shown). As shown in Table 3, when the upper semi-cylindrical member 21b is opened and upper side of the lower semi-cylindrical member 21a is in open state, the support 2 may be conveyed by the conveyer shuttlewise between a position above the lower semi-cylindrical member 21a and a position in the water bath 5 placed at a lower level in front of the lower semi-cylindrical member 21a.

The water bath 5 is filled with pure water. The water bath 5 is configured to have a rectangular shape having a size sufficient for housing both of the support 2 and the polycrystalline silicon rod R placed on the support 2, that is, sufficient for immersing both of the support 2 and the polycrystalline silicon rod R in the water. A longitudinal (lengthwise) direction of the water bath 5 is arranged parallel to a longitudinal direction of the support 2.

A plurality of nozzles 4 that constitute the local portion cooling unit are arranged onto the upper ends of inner surface of both side walls 5a along the longitudinal direction of the water bath 5. The nozzles 4 are directed from the side walls 5a of the water bath 5 to the inner direction and are configured to apply water to a polycrystalline silicon rod R from lateral direction during conveying the polycrystalline silicon rod R from the heating unit 3 to the water bath 5.

In this case, the nozzles 4 are arranged with spaces between adjacent nozzle along a horizontal direction on each of the side walls 5a, and nozzles 4 on a side wall (first side wall) 5a and nozzles 4 on an opposite side wall (second side wall) 5a are arranged in staggered manner. A middle position of each space between adjacent nozzles on a first side wall 5a is opposite to a nozzle on a second side wall 5a opposite to the first side wall 5a. That is, positions of the nozzles 4 on one side wall 5a are not opposite to the positions of nozzles 4 on the opposite side wall 5a. In the embodiment shown in FIG. 2, three nozzles 4 are arranged on a side wall 5a of front side of the water bath 5, and two nozzles 4 are arranged on a side wall 5a of back side of the water bath 5. A tip of each nozzle 4 protrudes from the side wall 5a of the water bath 5 towards an inner direction so as to eject water to apply the water to a polycrystalline silicon rod R from a relatively close distance when the polycrystalline silicon rod R on the support 2 is lifted down from a position above the water bath 5, and each nozzle 4 is configured such that water is applied to a spot-like area of the outer surface of the polycrystalline silicon rod R on the support 2. To allow the applying water to the spot-like area, each nozzle 4 is configured to eject water straightly from an aperture (pore) opened in the tip of the nozzle 4. It is possible to use commercially available nozzles as the above-described nozzles 4. For example, a straight type spay nozzle (K-18 Type) made of Katori Manufactory Ltd., a solid nozzle (straight, straight ejection nozzle of TRM type or H-U type) made of Spraying System Japan Co., Ltd., or the like may be used. Preferably, an aperture (bore) of the nozzle 4 has an area of not smaller than 0.5 and not larger than 20 mm$^2$. Preferably, each nozzle 4 is arranged such that a distance from a tip end of the nozzle 4 to an outer surface of the polycrystalline silicon rod R is not shorter than 1 mm and not longer than 200 mm. Preferably, the flow rate of ejection from each nozzle 4 is not less than 0.0006 m$^3$/minute and not more than 0.006 m$^3$/minute.

Next, a method of generating cracks in a polycrystalline silicon rod R using the thus constituted crack generating apparatus 1, and a method of producing polycrystalline silicon lumps by crushing the polycrystalline silicon rod R are explained.

Figure 4:
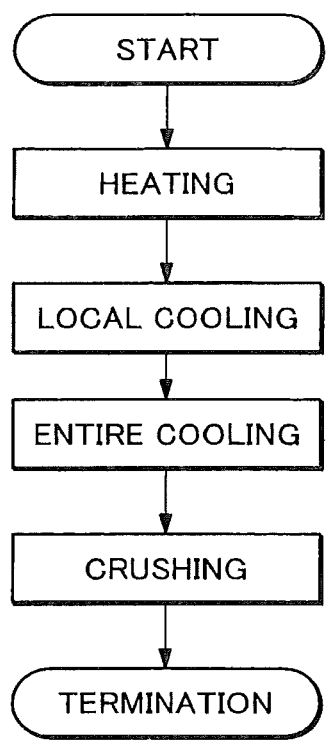
FIG. 4 is a flow chart of a method of producing a polycrystalline silicon lump according to the present invention.

As shown in the flow chart of FIG. 4, a method of producing polycrystalline silicon lumps of this embodiment includes: heating a polycrystalline silicon rod R, cooling a local portion of the heated polycrystalline silicon rod R, subsequently cooling an entire portion of the polycrystalline silicon rod R, and crushing the polycrystalline silicon rod R by mechanical impact after the cooling of the entire portion of the polycrystalline silicon rod R. For example, the mechanical impact may be applied by hammer blow or by using a machine such as a jaw-crusher or the like.

The polycrystalline silicon rod R is washed by pure water or an acid preliminarily. Then, the semi-cylindrical members 21a and 21b of the heating unit 3 are opened, the support 2 is installed in the lower semi-cylindrical member 21a, and a polycrystalline silicon rod R is placed on pipe members 11 of the support 2 as shown in FIG. 3.

At a state where the polycrystalline silicon rod R is placed on the pipe members 11 of the support 2, the semi-cylindrical member 21b is placed over the polycrystalline silicon rod R, thereby closing the two semi-cylindrical member 21a and 21b to form a cylinder. At the state where the polycrystalline silicon rod R is surrounded by the semi-cylindrical members 21a and 21b, the polycrystalline silicon rod R is heated by the heater 22 to have a surface temperature of, for example, 500 to 700° C. (Heating step). During the heating, cooling water is flowing in the pipe member 11.

After heating the polycrystalline silicon rod R, semi-cylindrical member 21a, 21b of the heating unit 3 are opened. By driving the conveyer, the support 2 is transferred from the heating unit 3 to the water bath 5 as shown in an open arrow in FIG. 2. During this stage, as shown by the arrows, water is ejected from each of nozzles 4 at the upper end of the water bath 5. As a result, in the intermediate state of lifting down the support 2 from a position above the water bath 5 to immersing the support 2 in water in the water bath 5, water is applied onto a surface of the polycrystalline silicon rod R on the support 2 from nozzles 4 on both side walls 5a. These nozzles 4 eject water to apply the water to spot-like area of the surface of the polycrystalline silicon rod R from a relatively close distance. In addition, since the nozzles 4 on each side wall 5a are arranged with spaces between adjacent nozzles along a horizontal direction, and nozzles 4 on opposite side wall 5 are arranged in staggered formation in the horizontal direction such that nozzles 4 in two side walls 5a are not in axisymmetric arrangement, water is applied to a plurality of positions (spot-like areas) dispersed on the surface of the polycrystalline silicon rod R (local portion cooling step).

Figure 5A:
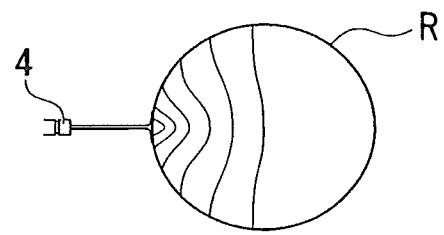
FIGS. 5A to 5C are schematic diagrams for explaining applying a refrigerant fluid to a polycrystalline silicon rod.
Figure 5B:
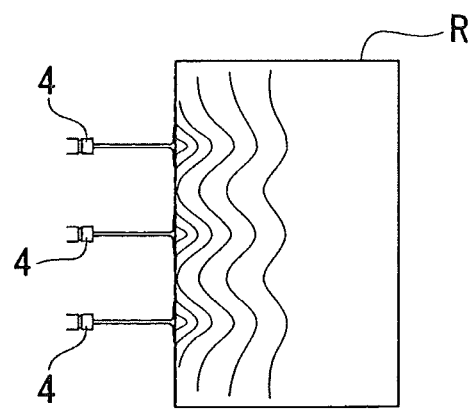
Figure 5C:
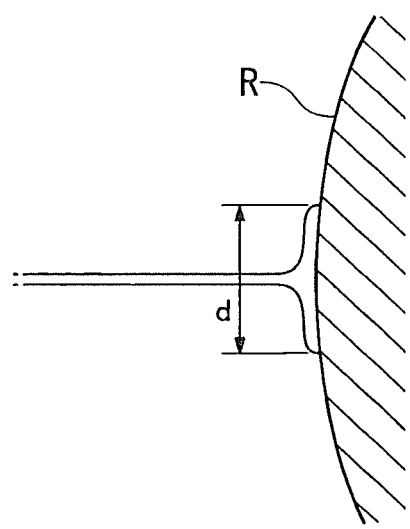

FIG. 5C shows a schematic cross sectional diagram showing a partial portion of the polycrystalline silicon rod R applied with water. In the local portion cooling, water ejected from each nozzle 4 is applied to a spot-like area of a surface of the polycrystalline silicon rod R, wherein each of the spot-like area has a diameter d of not smaller than 0.20 D and not larger than 0.32 D, where D denotes a diameter of the polycrystalline silicon rod R. Preferably, a difference in temperature between the center of the spot-like area and a position distant from the center by two times the diameter of the spot-like area is not lower than 150° C. due to the cooling.

Where the diameter d of the spot-like area is smaller than 0.20 (D denotes a diameter of the polycrystalline silicon rod R), cooled region is too small compared to the heat capacity of the polycrystalline silicon rod R. On the other hand, where a diameter d of the spot-like area exceeds 0.32 D, it is difficult to obtain an effect of local cooling since a large region is cooled entirely. In any of the cases, it is difficult to generate a steep thermal gradient from the spot-like area as a starting point of cooling, and cracks having a size sufficient for allowing easy crushing of the polycrystalline silicon rod R is not likely to occur. More preferably, a diameter of the spot-like area is not smaller than 0.21 D and not larger than 0.27 D, where D denotes the diameter of the polycrystalline silicon rod R. Where a difference of temperature between the center of the spot portion and a position distant from the center by twice the diameter of the spot portion is smaller than 150° C., it is difficult to generate large cracks because of small thermal gradient resulting in generation of small thermal stress.

Where a plurality of spots (spot-like areas) of the outer surface of the polycrystalline silicon rod R are cooled locally, thermal distribution generated in the polycrystalline silicon rod R as shown in FIGS. 5A and 5B shows thermal gradient from the spot where the polycrystalline silicon rod R is made to contact the water ejected from the nozzle 4, and the spot constitutes a starting point of cooling. FIGS. 5A and 5B schematically show isothermal lines in a polycrystalline silicon rod R. In the thermal distribution caused by applying the water, the temperature of the polycrystalline silicon rod R increases radially away from the portion sprayed with the water to the opposite portion, and the temperature increases in longitudinal direction with increasing distance from the portion sprayed with the water. Since a plurality of nozzles 4 are arranged with spaces between adjacent nozzles along the longitudinal direction of the polycrystalline silicon rod R, water ejected from the nozzles 4 hits a plurality of spots dispersed with spaces therebetween along the longitudinal direction of the polycrystalline silicon rod R, resulting in thermal distribution where the spots constitute starting points of cooling.

Figure 1:
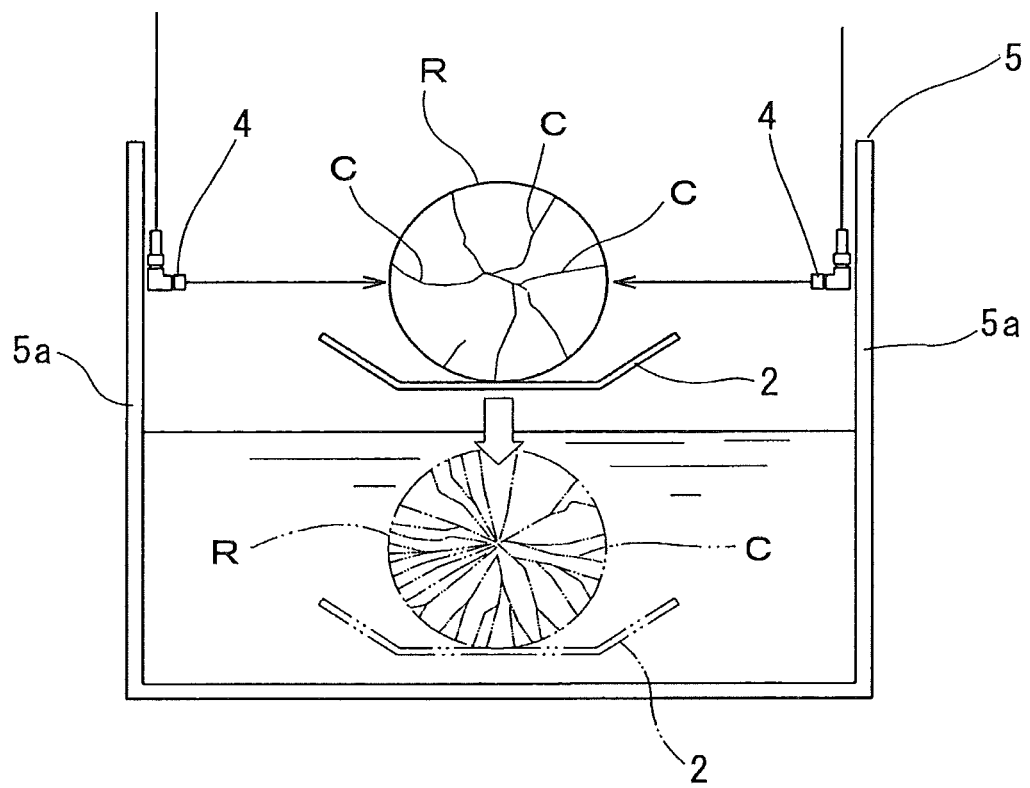
FIG. 1 is a vertical cross sectional view schematically showing an embodiment of an apparatus of generating cracks in a polycrystalline silicon rod according to the present invention. The figure shows a state where water is ejected from nozzles and applied to a polycrystalline silicon rod placed above a water bath.

Thermal stress caused by the above described thermal distribution generates cracks in respective portions of the polycrystalline silicon rod R. Most of the cracks are generated by cracking starting from the water-applied spot (spot-like area applied with water) on the surface of the polycrystalline silicon rod R, propagate across the polycrystalline silicon rod R from the water-applied spots to opposite portions. Therefore, cracks are also generated in the center portion (core portion) of the polycrystalline silicon rod R. The above-described state is schematically illustrated in FIG. 1 where cracks C are generated in the polycrystalline silicon rod R including the core portion as a result of applying water from the nozzles 4.

Preferably, spacing between adjacent nozzles 4 may be controlled depending on the diameter D of the polycrystalline silicon rod R. Preferably, spacing between adjacent nozzles is not smaller than 0.80 D and not larger than 1.36 D. The spacing between adjacent nozzles 4 substantially corresponds to a spacing between the centers of spot-like areas applied with water by the nozzles 4.

Thus, the polycrystalline silicon rod R is cooled locally by the water ejected from the nozzles 4 in an intermediate stage of lifting down the polycrystalline silicon rod R from a position above the water bath 5. After that, an entire portion of the polycrystalline silicon rod R is cooled by immersing the polycrystalline silicon rod R in the pure water in a water bath 5 (entire cooling step).

As described above, a plurality of cracks C propagating across the polycrystalline silicon rod R are generated preliminarily by the ejection of water from the nozzles 4 arranged on the upper end of the water bath 5. Where the polycrystalline silicon rod R of that state is immersed in the water, the water cools the outer surface of the polycrystalline silicon rod R and penetrates in each of cracks C resulting in further propagation of cracks and generation of secondary cracks from the fracture surface of the original cracks C.

As a result, cracks are generated in the outer surface and in the entire interior portion of the polycrystalline silicon rod R as shown in two-dot chain lines in FIG. 1. At that state, the polycrystalline silicon rod R is readily divided into a plurality of blocks.

Next, the support table 2 is lifted up from the water bath 5 and the polycrystalline silicon rod R is dried. After that, the polycrystalline silicon rod is divided to blocks, and each block is crushed into small lumps by hammer blow (crushing step). At that time, since cracks are preliminary generated in each of the blocks, each block can be easily crushed by impact with hammer or the like, and lumps of desired size can be obtained.

In the above-described method, the ejection of water at the upper end level of the water bath may be performed only while the polycrystalline silicon rod R pass through the level. Preferably, the polycrystalline silicon rod R may be stopped at the level of the water ejection, and water may be applied to the polycrystalline silicon rod R for a predetermined duration, for example, 10 seconds.

EXAMPLES

To confirm the effect of local portion cooling, the following experiments were carried out.

Experiment 1

Polycrystalline silicon rods having a diameter of 125 mm were prepared. After heating each polycrystalline silicon rod at about 650° C., water was applied to the polycrystalline silicon rod from a single nozzle placed at outer position radially distant from the polycrystalline silicon rod. In each case, water at a temperature of 25° C. was applied for a duration of 10 seconds. Diameter of the spot-like area applied with water on the surface of the polycrystalline silicon rod was varied by changing an aperture diameter of the nozzle, flow rate of water ejection from the nozzle, and the distance from a tip end of the nozzle to a surface of the polycrystalline silicon rod. After that, an occurrence of cracks in each rod was observed.

Where the cracks were generated throughout a periphery of the polycrystalline silicon rod, the occurrence of cracks was evaluated as good. Where generation of cracks remained in a partial portion of the rod and cracks throughout the periphery of the polycrystalline silicon rod were not observed, the occurrence of cracks were evaluated as bad. The results are shown in Table 1.

TABLE 1

| No. | Area of an aperture of nozzle (mm$^2$) | Diameter (d) of spot (mm) | Flow rate (m$^3$/minute) | Distance (mm) | Spot diameter/ rod diameter | Occurrence of cracks |
|---|---|---|---|---|---|---|
| 1 | 0.38 | 15 | 0.0003 | 200 | 0.12 | Bad |
| 2 | 0.50 | 25 | 0.0007 | 200 | 0.20 | Good |
| 3 | 0.78 | 27 | 0.0008 | 150 | 0.21 | Good |
| 4 | 7.06 | 31 | 0.0011 | 100 | 0.24 | Good |
| 5 | 12.56 | 34 | 0.003 | 50 | 0.27 | Good |
| 6 | 19.63 | 40 | 0.006 | 30 | 0.32 | Good |
| 7 | 28.27 | 46 | 0.008 | 25 | 0.36 | Bad |

In the single spot cooling experiment, in each of samples where the spot diameter was 25 mm to 40 mm, in other words, where the ratio of spot diameter to a diameter of the polycrystalline silicon rod was 0.20 to 0.32, cracks were generated throughout the periphery of the polycrystalline silicon rod directly after the spraying of water.

Figure 6:
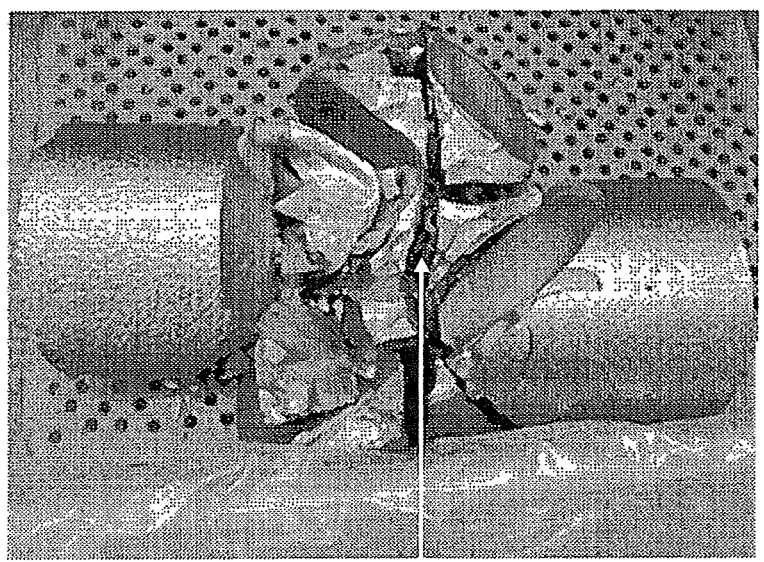
FIG. 6 is a photograph showing a broken state of a polycrystalline silicon rod that reflects an occurrence of cracks in a polycrystalline silicon rod caused by a single, spot cooling.

When these samples were lightly hit by a hammer, cracks propagated from the cooling spot of the polycrystalline silicon rod, and the rod was broken as shown in FIG. 6. In FIG. 6, the position pointed by the arrow is the cooling spot. The results shown in Table 1 shows that it is preferable to spray water to the polycrystalline silicon rod such that a ratio of the diameter of the spot-like area to the diameter of the polycrystalline silicon rod is 0.20 to 0.32.

Experiment 2

Next, using a plurality of nozzles, water was sprayed to plural spots of each polycrystalline silicon rod. In this case, the nozzles were arranged with spaces on one side along a lengthwise direction of the polycrystalline silicon rod (this arrangement is referred to as one side arrangement). Aperture diameter of each nozzle was 1 mm φ, flow rate of water ejected from each nozzle was 0.008 m$^3$/minute, and a ratio of spot diameter/rod diameter was 0.21. The number of nozzles and the spacing between adjacent nozzles were varied as shown in Table 2. Polycrystalline silicon rods used in this experiment had a diameter of 125 mm and a length of 280 mm. In a similar manner as in Experiment 1, each polycrystalline silicon rod was heated to 650° C., and was subjected to spot cooling by spraying of water at 25° C. for 10 seconds, and was subsequently lightly hit by a hammer made of a cemented carbide. The results are shown in Table 2.

TABLE 2

| No. | Arrangement of nozzles | Number of nozzles | Spacing between adjacent nozzles (mm) | Occurrence of cracks |
| --- | --- | --- | --- | --- |
| 8 | one side | 2 | 90 | B |
| 9 | one side | 2 | 100 | A |
| 10 | one side | 3 | 90 | B |
| 11 | one side | 3 | 100 | A |

In Table 2, occurrence of cracks expressed by "A" denotes a case where cracks were generated throughout a periphery of the polycrystalline silicon rod like in the case of single spot cooling. An occurrence of cracks expressed by "B" denotes a case where propagation of cracks in the circumferential direction was small and cracks propagated to a direction (lengthwise direction of the polycrystalline silicon rod) communicating the spots.

Surprisingly and unexpectedly, occurrence of cracks in the circumferential direction was remarkable in samples 9 and 11 which were applied with water from nozzles arranged with larger spacing than the spacing of nozzles in the case of samples 8 and 10.

Figure 7:
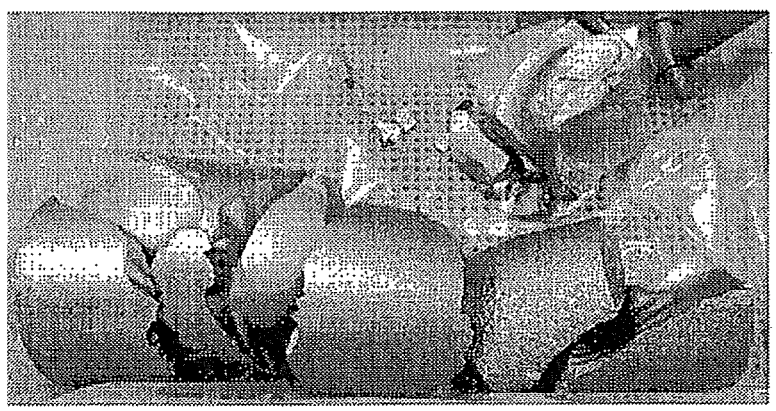
FIG. 7 is a photograph showing a broken state of a polycrystalline silicon rod that reflects an occurrence of cracks in a polycrystalline silicon rod caused by cooling of two spot-like areas using nozzles arranged with a space therebetween of 100 mm.
Figure 8:
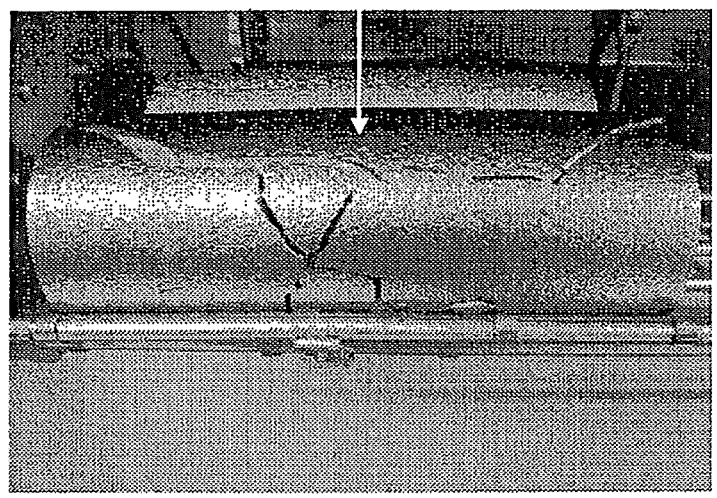
FIG. 8 is a photograph showing a broken state of a polycrystalline silicon rod that reflects an occurrence of cracks in a polycrystalline silicon rod caused by cooling of two spot-like areas using nozzles arranged with a space therebetween of 90 mm.

FIG. 7 shows a broken state of a polycrystalline silicon rod of sample No. 9 after being hit by a hammer. In this sample, cracks were generated throughout a periphery of the polycrystalline silicon rod, and the rod was broken from the cracks completely. FIG. 8 shows a broken state of a polycrystalline silicon rod of sample No. 10 after being hit by a hammer. In this sample, cracks propagated to a lengthwise direction of the polycrystalline silicon rod, and propagation of cracks stopped in the circumferential direction and the cracks did not propagate to the core portion. As a result, as shown by arrow, large lumps of polycrystalline silicon remained on the opposite side of the cooling spot.

Where spacing of nozzles was 90 mm, crack propagated to lengthwise direction of the polycrystalline silicon rod. This occurrence may be explained by a small temperature difference between the center of the spot and a position distant from the center by 2 times the diameter of the polycrystalline silicon rod because of the small spacing between the adjacent spot.

Experiment 3

Next, similar cracking experiment was carried out using nozzles arranged on both side of the polycrystalline silicon rod, where nozzles were arranged along a single line in each side (hereafter, this arrangement is referred to as two side arrangement). An occurrence of cracks was examined in a case where nozzles on one side were arranged to opposite positions of the nozzles on the other side, that is, positions rotated 180° from the positions of nozzles on the other side around an axis of the polycrystalline silicon rod (this arrangement is referred to as opposite arrangement). Occurrence of cracks was also examined in a case where nozzles on one side were arranged to intermediate positions between opposite positions of the nozzles on the other side (this arrangement is referred to as non opposite arrangement). The aperture diameter of each nozzle was about 1 mm, and the flow rate of ejection was 0.0008 m³/minute. A ratio of spot diameter/rod diameter was 0.21. The water at a temperature of 25° C. was sprayed for 10 seconds. Each polycrystalline silicon rod had a diameter of 125 mm and a length of 280 mm. After heating the polycrystalline silicon rod at about 650° C., the rod was subjected to a cooling experiment. The results are shown in Table 3.

TABLE 3

| No. | Arrangement of nozzles | Number of nozzles | Space between adjacent nozzles (mm) | Occurrence of cracks |
| --- | --- | --- | --- | --- |
| 12 | opposite arrangement | two on each side | 100 | D |
| 13 | non-opposite arrangement | two on each side | 100 | E |
| 14 | non-opposite arrangement | two on one side and three on opposite side | 100 | E |

Figure 9:
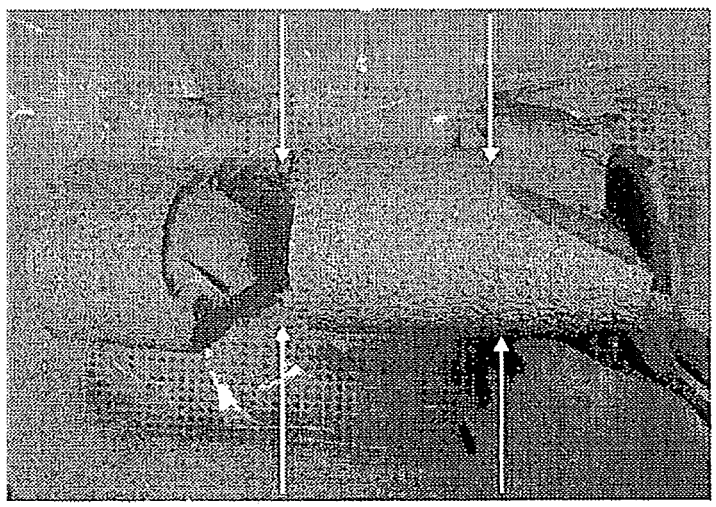
FIG. 9 is a photograph showing a broken state of a polycrystalline silicon rod that reflects an occurrence of cracks in a polycrystalline silicon rod caused by cooling using nozzles where each two nozzles are arranged on each side in opposite formation.
Figure 10:
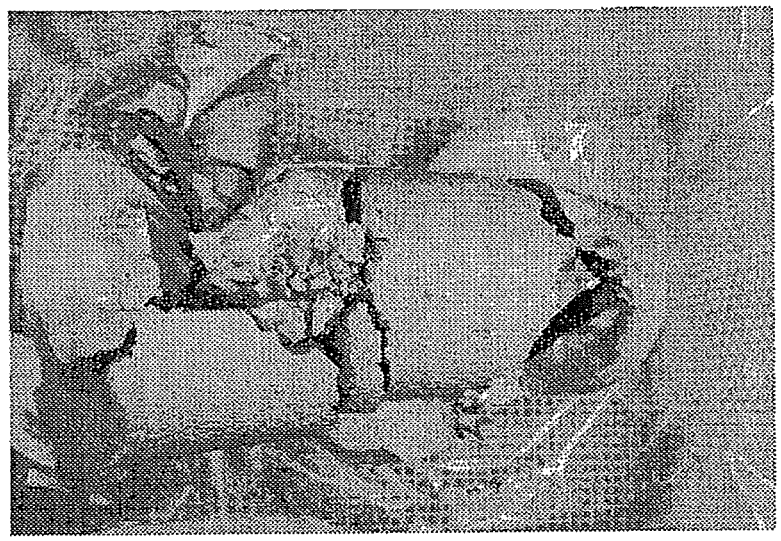
FIG. 10 is a photograph showing a broken state of a polycrystalline silicon rod that reflects an occurrence of cracks in a polycrystalline silicon rod caused by cooling using nozzles where two nozzles on one side are arranged in staggered formation with respect to three nozzles on the other side.

In Table 3, occurrence of crack expressed by "D" denotes a case where cracks were generated throughout a periphery of the polycrystalline silicon rod like in the case of single spot cooling. Where the polycrystalline silicon rod of this case was hit by a hammer, the rod was broken along the cracks. However, a relatively large lump remained since cracks were not likely to occur in a portion other than a vicinity of the cooling spot. In the case showing occurrence of cracks expressed by "E" in Table 3, cracks were generated in 80% or more by volume of the entire portion of the polycrystalline silicon rod, although cracking was not likely to occur in small portions on both end portions of the polycrystalline silicon rod. FIG. 9 shows a sample No. 12, and FIG. 10 shows a sample No. 14. Both of the figures show broken state of samples after being hit by a hammer.

Experiment 4

Using the arrangement of nozzles shown in No. 14, polycrystalline silicon rods were subjected to cooling experiment where water was sprayed continuously while stopping the polycrystalline silicon rod in front of the nozzles for 3 to 10 seconds. The other experimental conditions were similar to those of Experiment 3. By hitting each polycrystalline silicon rod by a hammer, the polycrystalline silicon rod was easily crushed into small lumps. Sizes of the lumps were related to the duration of water spraying. Where the duration of water spraying was 3 seconds, four to six fragments among twenty three fragments had a maximum length of 50 mm or more. Where the duration of water spraying was 5 seconds, two to three fragments among forty three fragments had a maximum length of 50 mm or more. Where the duration of water spraying was 10 seconds, none of fragments had a size of 50 mm or more.

Cracks were also generated in the case of spraying water while moving (lifting down) the polycrystalline silicon rod, and the rod was crushed into lumps by hitting by a hammer. However, in this case, the proportion of large sized lumps was relatively larger than the case where water was applied to the polycrystalline silicon rod at a stopped state.

Figure 11:
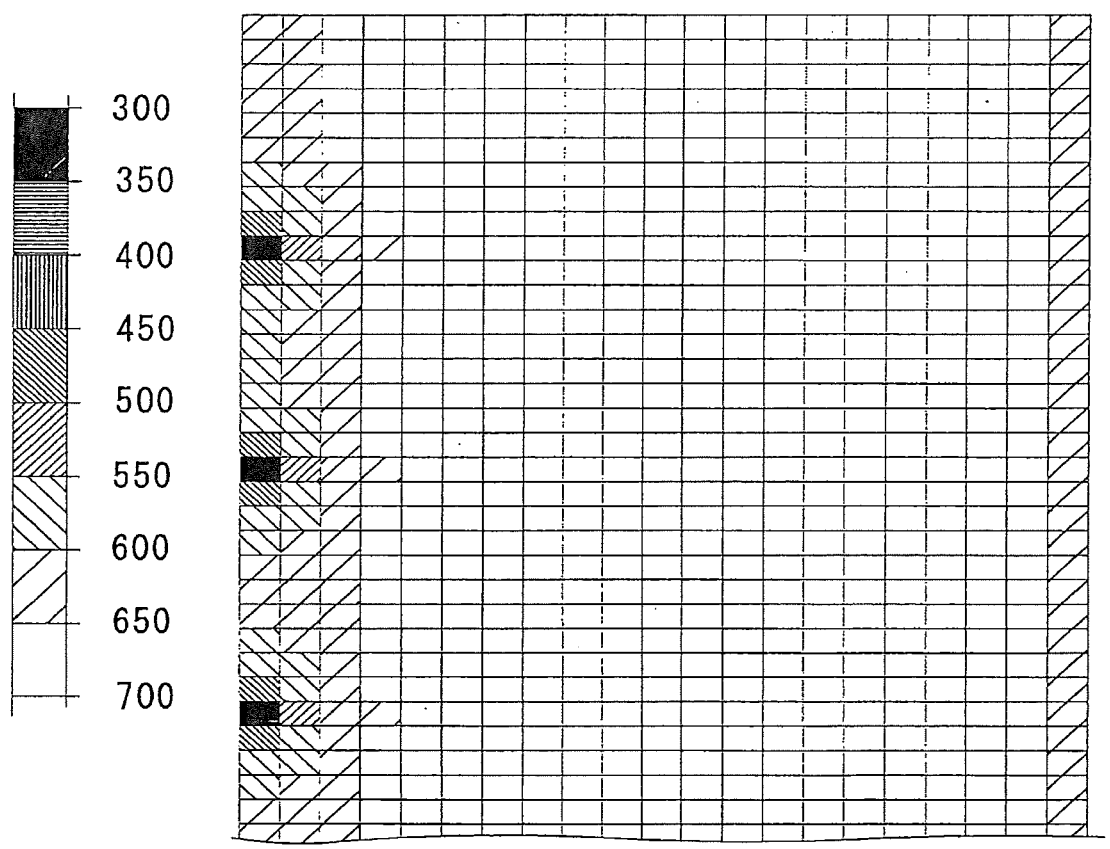
FIG. 11 is a model diagram showing a result of simulation analysis of thermal distribution in a polycrystalline silicon rod applied with water.

By a simulation analysis of thermal distribution in the polycrystalline silicon rod, the result shown in FIG. 11 was obtained. In FIG. 11, one block was 5.7 mm square, spot diameter was 5.7 mm, temperature difference between the center of the spot and a position distant from the center by two times the spot diameter was 216° C. in the longitudinal direction of the rod, and 264° C. in the radial direction (direction towards the center).

Figure 12:
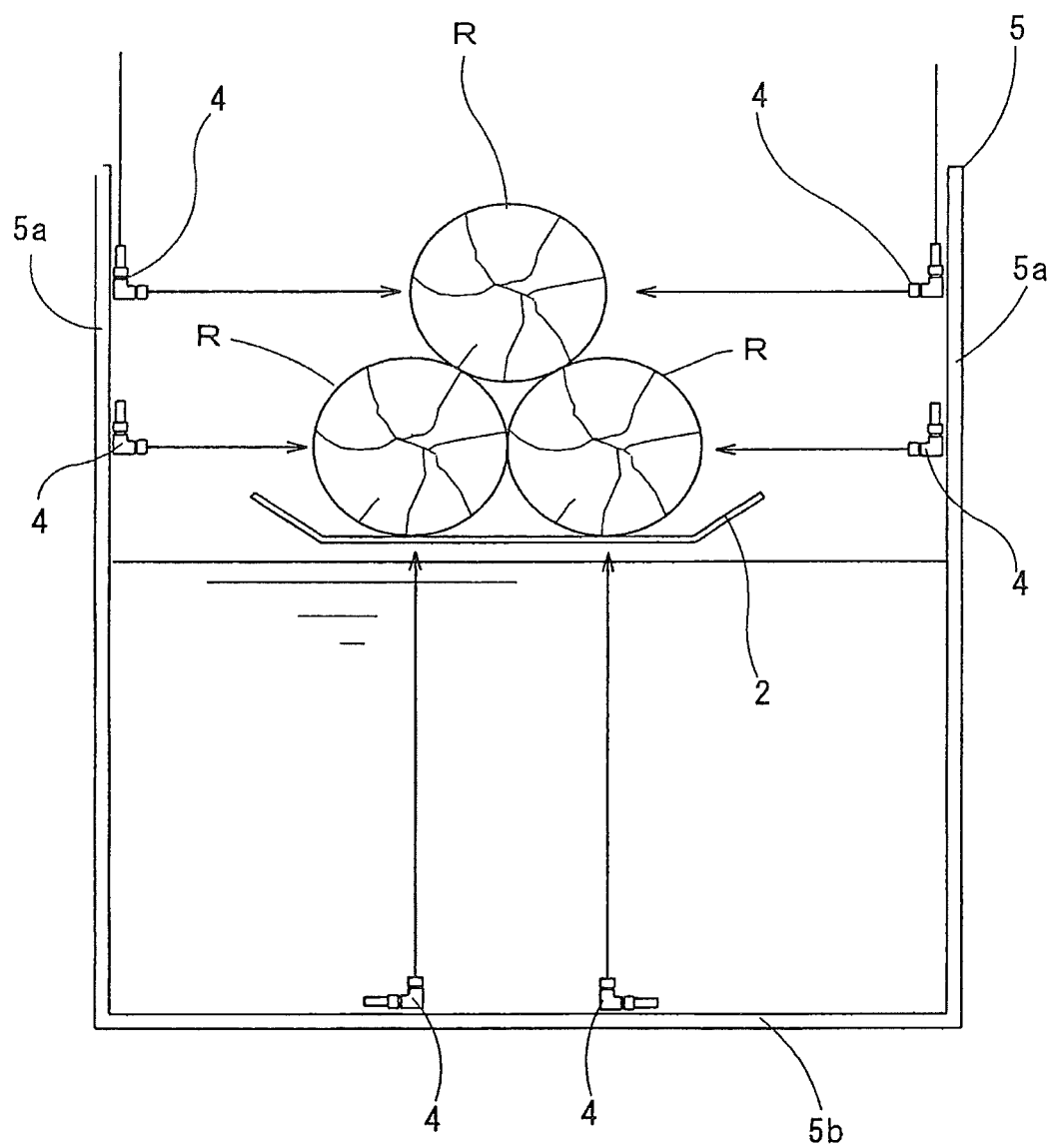
FIG. 12 is a vertical cross sectional view schematically showing an embodiment of an apparatus of generating cracks in a polycrystalline silicon rod according to the present invention. The figure shows a state where water is applied to a plurality of polycrystalline silicon rods placed on a support.

While the above-described embodiment was explained for a case where a single polycrystalline silicon rod was heated and rapidly cooled, it is possible to heat and rapidly cool a plurality of polycrystalline silicon rods simultaneously. For example, FIG. 12 shows a case where water is sprayed to three polycrystalline silicon rods R placed on a support 2 in parallel arrangement such that one rod R is supported by two rods R. In this case, nozzles 4 are arranged on the bottom wall 5b of the water bath 5 as well as on the side walls 5a, and water is sprayed to plural spots along a circumferential direction of each of the polycrystalline silicon rods R from plural directions (two directions in FIG. 12). Where the water is applied from the nozzles 4 arranged on the bottom wall 5b, the water bath may be filled with water after the local portion cooling. Alternatively, nozzles 4 may be provided movably to positions beneath the polycrystalline silicon rods R and above the surface of the water in the water bath 5 during the local portion cooling.

Where a water bath is provided for immersing the polycrystalline silicon rod in water, the water bath may be configured to spray water to a surface of the polycrystalline silicon rod installed in the water bath. By this configuration, an occurrence of film boiling phenomenon can be surely prevented.

Preferably, pure water is used as the refrigerant fluid in the local portion cooling. While water was used as a refrigerant fluid to be sprayed to the polycrystalline silicon rod in the above-described embodiment, liquid nitrogen or the like may also be used as the refrigerant fluid. While the height of the nozzles arranged on both side of the polycrystalline silicon rod are set at the same level in the embodiment shown in FIG. 1, it is possible to arrange the nozzles on both sides at different levels. Where nozzles on a first side is set at a level higher than nozzles on a second side, water is sprayed to the polycrystalline silicon rod from the first side and from the second side with an interval of time. Alternatively, the nozzles are set at the same level on both sides and the water may be sprayed alternately from a different side. In the above-described embodiment, water bath was provided to entirely cool the polycrystalline silicon rod after locally cooling the rod. As an alternative, the entire cooling unit may be configured to spray shower of refrigerant fluid to the entire surface of the polycrystalline silicon rod.

While preferred embodiments of the invention have been described and illustrated above, it should be understood that these are exemplary of the invention and are not to be considered as limiting. Additions, omissions, substitutions, and other modifications can be made without departing from the scope of the present invention. Accordingly, the invention is not to be considered as being limited by the foregoing description, and is only limited by the scope of the appended claims.

What is claimed is:

1. An apparatus of generating cracks in a polycrystalline silicon rod by heating the polycrystalline silicon rod and subsequently quenching the polycrystalline silicon rod, comprising:
    a heating unit to heat a polycrystalline silicon rod; and
    a local portion cooling unit by which a refrigerant fluid is applied onto at least one spot-like area of a surface of the polycrystalline silicon rod,
    wherein each of the spot-like area has a diameter of not smaller than 0.20 D and not larger than 0.32 D, where D denotes a diameter of the polycrystalline silicon rod.

2. The apparatus of generating cracks in a polycrystalline silicon rod according to claim 1, wherein
    the local portion cooling unit includes nozzles which are arranged on both sides of the polycrystalline silicon rod, wherein
    a plurality of nozzles are arranged with spaces between adjacent nozzles on each side of the polycrystalline silicon rod along a lengthwise direction of the rod such that a substantially middle position of each space between adjacent nozzles on a first side faces a nozzle on a second side.

3. The apparatus of generating cracks in a polycrystalline silicon rod according to claim 1, further comprising
    an entire portion cooling unit that makes a refrigerant substance contact an entire surface of the polycrystalline silicon rod.

4. The apparatus of generating cracks in a polycrystalline silicon rod according to claim 3, wherein
    the refrigerant substance is a refrigerant fluid.

* * * * *